US012793746B2

(12) United States Patent
Yeom et al.

(10) Patent No.: US 12,793,746 B2
(45) Date of Patent: Nov. 10, 2026

(54) SEMICONDUCTOR MEMORY DEVICE HAVING A SEPARATION INSULATING STRUCTURE AND METHOD OF MANUFACTURING A SEMICONDUCTOR MEMORY DEVICE HAVING A SEPARATION INSULATING STRUCTURE

(71) Applicant: SK hynix Inc., Icheon-si (KR)

(72) Inventors: Hyo Sub Yeom, Icheon-si (KR); Kyoung Sik Han, Icheon-si (KR)

(73) Assignee: SK hynix Inc., Icheon-si (KR)

(*) Notice: Subject to any disclaimer, the term of this patent is extended or adjusted under 35 U.S.C. 154(b) by 475 days.

(21) Appl. No.: 18/485,616

(22) Filed: Oct. 12, 2023

(65) Prior Publication Data

US 2024/0420739 A1 Dec. 19, 2024

(30) Foreign Application Priority Data

Jun. 13, 2023 (KR) ........................ 10-2023-0075442

(51) Int. Cl.
*G11C 5/06* (2006.01)
*H10B 41/27* (2023.01)
*H10B 43/27* (2023.01)

(52) U.S. Cl.
CPC ............. *G11C 5/063* (2013.01); *H10B 41/27* (2023.02); *H10B 43/27* (2023.02)

(58) Field of Classification Search
CPC ........ H10B 41/27; H10B 43/27; H10B 41/35; H10B 43/35; H10B 41/30; H10B 43/30
See application file for complete search history.

(56) References Cited

U.S. PATENT DOCUMENTS

| | | | | |
|---|---|---|---|---|
| 2018/0190668 A1* | 7/2018 | Kim | ........................ | H10B 43/10 |
| 2021/0313343 A1* | 10/2021 | Jung | ........................ | H10B 43/10 |
| 2022/0077182 A1* | 3/2022 | Lee | ........................ | H10B 43/27 |
| 2022/0310652 A1* | 9/2022 | Son | ........................ | H10B 43/27 |
| 2023/0247835 A1* | 8/2023 | Sim | ........................ | H10B 43/27 257/314 |

FOREIGN PATENT DOCUMENTS

| | | |
|---|---|---|
| KR | 1020190010403 A | 1/2019 |
| KR | 1020210124836 A | 10/2021 |

* cited by examiner

*Primary Examiner* — Davienne N Monbleau
*Assistant Examiner* — Emily Farmer
(74) *Attorney, Agent, or Firm* — WILLIAM PARK AND ASSOCIATES LTD.

(57) ABSTRACT

A semiconductor memory device may include first gate structures each including first real gate lines and first insulating layers that are alternately stacked. The device may also include first dummy gate lines located on the first gate structures, a separation insulating structure configured to extend between the first dummy gate lines and between the first gate structures, and a second gate structure located on the first gate structures and the separation insulating structure and comprising a second dummy gate line having a greater width than each of the first dummy gate lines.

32 Claims, 8 Drawing Sheets

SEMICONDUCTOR MEMORY DEVICE HAVING A SEPARATION INSULATING STRUCTURE AND METHOD OF MANUFACTURING A SEMICONDUCTOR MEMORY DEVICE HAVING A SEPARATION INSULATING STRUCTURE

CROSS-REFERENCE TO RELATED APPLICATION

This application claims priority under 35 U.S.C. § 119 (a) to Korean Patent Application No. 10-2023-0075442 filed on Jun. 13, 2023, in the Korean Intellectual Property Office, which is incorporated herein by reference in its entirety.

BACKGROUND

1. Technical Field

Embodiments relate to an electronic device and a method of manufacturing an electronic device. More particularly, the disclosed embodiments relate to a semiconductor memory device and a method of manufacturing a semiconductor memory device.

2. Related Art

Semiconductor memory device integration is basically determined by the area occupied by a unit memory cell. As semiconductor memory device integration has improved, the area occupied by a memory cell formed on a substrate as a single layer recently may have reached its limit, a three-dimensional semiconductor memory device in which memory cells are stacked on top of each other, on a substrate has appeared. Various structures and manufacturing methods have been developed to improve the operation and the reliability of such semiconductor memory devices.

SUMMARY

In an embodiment, a semiconductor memory device may include first gate structures each, each gate structure including first real gate lines and first insulating layers, which are alternately stacked. Each gate structure also including first dummy gate lines, located on the first gate structures, a separation insulating structure configured to extend between the first dummy gate lines and the first gate structures, and, a second gate structure located on both the first gate structures and the separation insulating structure and comprising a second dummy gate line having a greater width than each of the first dummy gate lines.

In an embodiment, a method of manufacturing a semiconductor memory device may include forming a first stack including first material layers and second material layers that are alternately stacked, forming a first sacrificial layer on the first stack, forming a second sacrificial layer on the first sacrificial layer, forming an opening that extends into the first stack through the second sacrificial layer and the first sacrificial layer, forming a preliminary insulating structure within the opening, forming a separation insulating structure within the opening by etching the preliminary insulating structure and the second sacrificial layer so that the first sacrificial layer is exposed, and forming, on the separation insulating structure and the first sacrificial layer, a second stack including third material layers and fourth material layers that are alternately stacked.

DETAILED DESCRIPTION

Hereinafter, embodiments according to the technical spirit of the present disclosure are described with reference to the accompanying drawings.

Embodiments of the present disclosure provide a semiconductor memory device having a stable structure and improved characteristics and a method of manufacturing a semiconductor memory device having a stable structure and improved characteristics.

Figure 1:
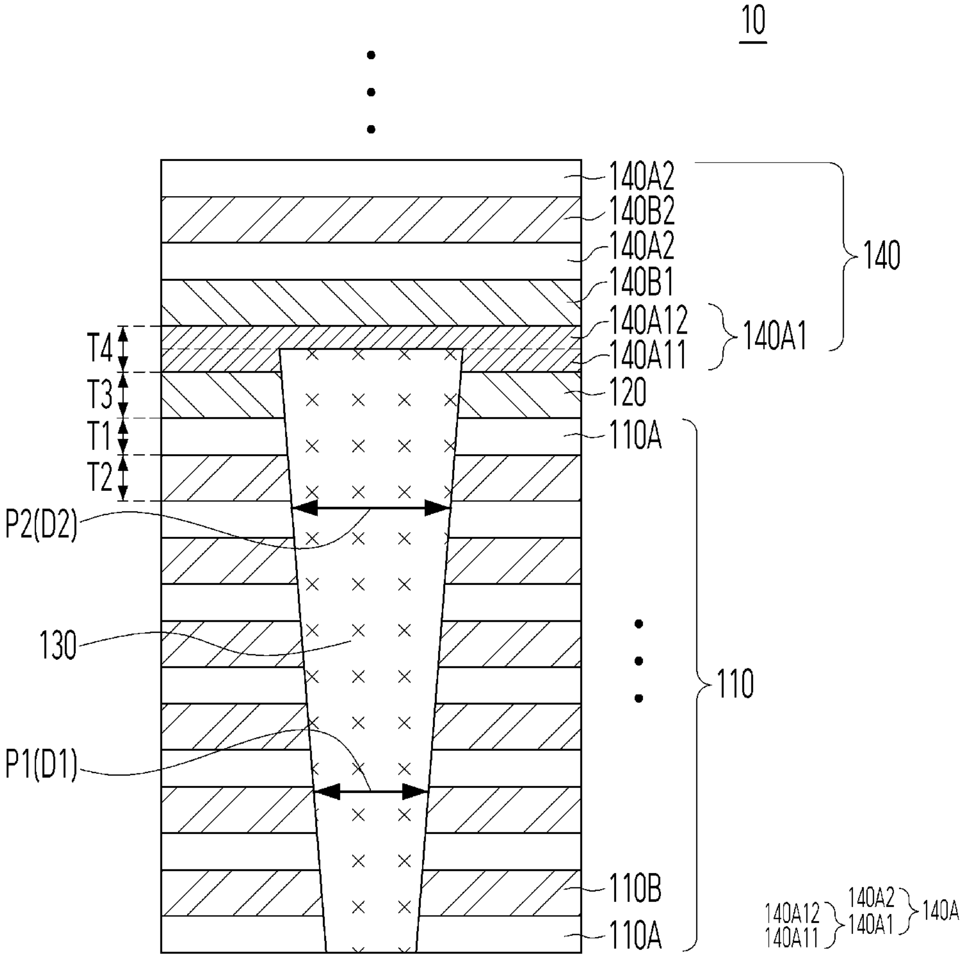
FIG. 1 is a vertical cross-sectional diagram for describing a semiconductor memory device according to an embodiment of the present disclosure.

FIG. 1 is a diagram depicting a vertical cross section of a semiconductor memory device 10 according to an embodiment of the present disclosure and showing various layers (also known as strata) of different types of material, the different-material layers that are stacked on top of each other embodying a semiconductor memory device. A layer or stratum of a material is essentially a thin sheet of material, regardless of how it was formed. As used herein, the word "line" should be construed as referring to a layer.

Referring to FIG. 1, the semiconductor memory device 10 may include first gate structures 110, a first dummy gate lines 120, and a separation insulating structure 130. The device 10 may also include the first gate structures 110, the first dummy gate lines 120, the separation insulating structure 130, and a second gate structure 140.

The first gate structures 110 may each comprise layers of first real gate lines 110B and first insulating layers 110A, which are stacked on top of each other. Such alternately stacked layers 110B and 110A, are considered herein as being "alternately stacked" as well as "interleaved." Therefore, "alternately stacked" and "interleaved" may hereinafter be used interchangeably.

The first insulating layers 110A may each have a first thickness T1. The first real gate lines (which may also be referred to as layers) 110B may each have a second thickness T2. The first thickness T1 may be substantially the same as or different from the second thickness T2. For example, the second thickness T2 may be greater than the first thickness T1.

The first insulating layers 110A may each include an insulating material, such as an oxide. The first real gate lines (layers) 110B may each include a conductive material, such as tungsten, molybdenum, or polysilicon. The first real gate lines (layers) 110B may each be a selection line or a word line. For example, the first real gate lines 110B may each be a selection line.

The first dummy gate lines 120 may be located on the first gate structures 110, respectively. The first dummy gate lines 120 may each have a third thickness T3. The third thickness T3 may be substantially the same as or different from the second thickness T2. For example, the third thickness T3 may be substantially the same as the second thickness T2. The first dummy gate lines 120 may each include a conductive material, such as tungsten, molybdenum, or polysilicon. The first dummy gate lines 120 may each be a dummy selection line or a dummy word line. For example, the first dummy gate lines 120 may each be a dummy word line.

The separation insulating structure 130 may be located between the first gate structures 110. For example, the separation insulating structure 130 may extend between the first dummy gate lines (layers) 120 and between the first gate structures 110.

The separation insulating structure 130 may be tapered such that a first part P1 located near the bottom, has a first width D1, which is less than a second width D2 of second part P2, which as shown is closer to the second gate structure 140 than the first part P1. The tapered separation insulating structure 130 may be located between the first gate structures 110, and may insulate at least one gate line 110B, among the first real gate lines 110B at a corresponding level, between the first gate structures 110. The first real gate lines 110B insulated by the separation insulating structure 130 may each be used as a source selection line.

The second gate structure 140 may be located above, i.e., on top of, the first gate structures 110. For example, the second gate structure 140 may be located over the first gate structures 110 and above the separation insulating structure 130. The second gate structure 140 may include a second dummy gate line 140B1, which may be electrically connected to the first dummy gate lines 120. The second dummy gate line 140B1 may be either a dummy word line or a dummy selection line.

As used herein, the phrase "real gate line" should be construed in light of the phrase "dummy gate line," which is refers to a conductor, i.e., a line, which is electrically connected to the gate of a transistor that does not actually store data. A "real gate line" should therefore be construed as referring to a gate line, which is NOT a dummy gate line. Stated another way, a "real gate line" may be construed as a conductor, i.e., a line, which is electrically connected to the gate of a transistor, which stores data, i.e., an actual gate line.

The second gate structure 140 may include a second real gate line 140B2 stacked over the second dummy gate line 140B1, and second insulating layers 140A that are alternately stacked along with the second real gate lines 140B2 over the second dummy gate line 140B1. In this case, the second insulating layers 140A may each include an insulating material, such as oxide. The second real gate lines 140B2 may each include a conductive material, such as tungsten, molybdenum, or polysilicon. The second dummy gate line 140B1 may be a dummy selection line or a dummy word line. For example, the second dummy gate line 140B1 may be a dummy word line. The second real gate lines 140B2 may each be a selection line or a word line. For example, the second real gate lines 140B2 may each be a word line. For reference, the dummy gate lines 120 and 140B1 may be the real gate lines 110B and 140B2. For example, the first dummy gate line 120 may be used as the first real gate line 110B, and the second dummy gate line 140B1 may be used as the second real gate line 140B2.

A lowermost second insulating layer 140A1, among the second insulating layers 140A, may include a sacrificial layer 140A11 and an insulating layer 140A12 that is located on the sacrificial layer 140A11. In this case, the sacrificial layer 140A11 may be a layer that is used as a polishing stop layer and that remains in a process of forming the separation insulating structure 130. The insulating layer 140A12 may be a layer that is formed on the sacrificial layer 140A11 and the separation insulating structure 130. Accordingly, the lowermost second insulating layer 140A1 including the sacrificial layer 140A11 and the insulating layer 140A12 may be formed. The sacrificial layer 140A11 and the insulating layer 140A12 may each be oxide layers, which may be formed by the same process or separate and different processes. An interface, not shown, may be present between the sacrificial layer 140A11 and the insulating layer 140A12. If, however, the sacrificial layer 140A11 and the insulating layer 140A12 include the same material, an interface might not be present.

The sacrificial layer 140A11 may be, oxide layer formed by a separate process before the separation insulating structure 130 is formed, and may be used as a polishing-stop layer in a process of forming the separation insulating structure 130. If the sacrificial layer 140A11 is not separately formed, the sacrificial layer 140A11 may be formed at the same level as the first dummy gate lines 120. Accordingly, a nitride layer that is substituted with the first dummy gate lines 120 in a subsequent process may be used as a polishing stop layer. In other words, the nitride layer may be formed to have a relatively great thickness from the beginning, and may be used as a polishing stop layer in a process of forming the separation insulating structure 130. In this case, the nitride layer may be etched by some thickness. Accordingly, the third thickness T3 of each of the first dummy gate lines 120 and the second thickness T2 of each of the first real gate lines 110B may be different from each other.

In a process of forming the gate lines 120 and 110B, a seam may occur at a level corresponding to the first dummy gate lines 120 due to a difference between the thicknesses of the gate lines 120, 110B that form a conductive material. A fluorine-series source gas may remain within the seam. Surrounding layers may be damaged because a fume occurs due to the fluorine-series source gas. However, in the present disclosure, the third thickness T3 and the second thickness T2 may be substantially the same and the occurrence of a seam or fume can be reduced because the sacrificial layer 140A11 is used as a polishing stop layer.

The lowermost second insulating layer 140A1 may contact, i.e., mechanically contact or touch the separation insulating structure 130. As shown in FIG. 1, the top end of the separation insulating structure 130 may contact a lower surface of the insulating layer 140A12 and may extend through and physically contact the sacrificial layer 140A11. In other words, the separation insulating structure 130 may extend "upward" into the lowermost second insulating layer 140A1.

An upper surface of the separation insulating structure 130 may be located between an upper surface and lower surface of the lowermost second insulating layer 140A1. The lowermost second insulating layer 140A1 may have a fourth thickness T4. The fourth thickness T4 may be substantially the same as or different from the first thickness T1 or the second thickness T2. For example, the fourth thickness T4 may be greater than the first thickness T1. The remaining second insulating layers 140A2 may have substantially the same thickness as the first thickness T1.

Furthermore, the fourth thickness T4 of the lowermost second insulating layer 140A1, and the first thickness T1 of each of the first insulating layers 110A and the thickness of each of the remaining second insulating layers 140A2 may be different from each other because the sacrificial layer 140A11 is formed by a separate process. However, the thicknesses of the first dummy gate line 120 and the first real gate line 110B may be substantially the same because the sacrificial layer 140A11 is formed by a separate process. In other words, the thicknesses of the nitride layers for forming the gate lines 120, 110B can be uniformly formed because the sacrificial layer 140A11, that is, oxide layer, is separately formed. In this case, the sacrificial layer 140A11, each of the first insulating layers 110A1, and each of the second insulating layers 140A2 may include an oxide.

According to the aforementioned description, first real gate lines 110B at the same elevation level in the memory device 10 can be mutually insulated from each other by the separation insulating structure 130. Similarly, first dummy gate lines 120 at the same level can also be mutually insulated by the separation insulating structure 130. Accordingly, each of the first real gate lines 110B that have been mutually insulated or each of the first dummy gate lines 120 that have been mutually insulated can be driven individually.

The gate lines that are located adjacent to an interface between the first gate structure 110 and the second gate structure 140 may be used as dummy gate lines 120 and 140B1. The remaining gate lines may be used as, and considered to be, real gate lines 110B and 140B2. Furthermore, the dummy gate lines 120 and 140B1 may be electrically connected, and may be driven by the same bias. Accordingly, the risk of real gate lines 110B and 140B2 being bridged can be reduced.

Furthermore, in a process of forming the separation insulating structure 130, the thicknesses of the first dummy gate lines 120 and the first real gate lines 110B can be substantially the same because the sacrificial layer 140A11, which is an oxide layer, may be used as a polishing-stop layer. Accordingly, the occurrence of a seam or fume substantially at the same level as the first dummy gate lines 120 can be reduced.

Figure 2:
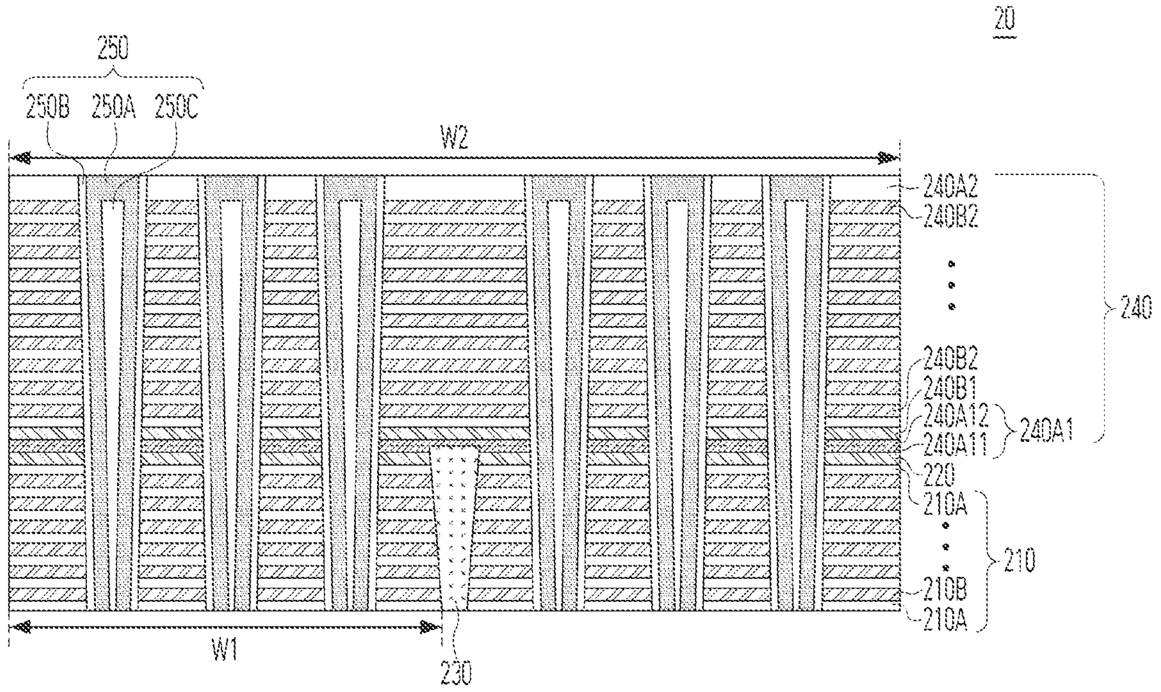
FIG. 2 is a vertical cross-sectional diagram for describing a semiconductor memory device according to an embodiment of the present disclosure.

FIG. 2 is another vertical cross sectional diagram of a semiconductor memory device 20 according to another embodiment of the present disclosure. Hereinafter, descriptions of contents is omitted in the interest of brevity.

Referring to FIG. 2, the semiconductor memory device 20 may include first gate structures 210, first dummy gate lines 220, a separation insulating structure 230, or a second gate structure 240 or may include the first gate structures 210, the first dummy gate lines 220, the separation insulating structure 230, or the second gate structure 240 in combination. The semiconductor memory device 20 may further include channel structures 250.

The first gate structures 210 may each have a first width W1. In this case, the first width W1 may be the width of an upper surface of each of the first gate structures 210, may be the width of a lower surface of each of the first gate structures 210, or may be a middle width between the upper surface and lower surface of each of the first gate structures 210. The second gate structure 240 may have a second width W2 different from the first width W1. For example, the second width W2 may be greater than the first width W1. Accordingly, the second gate structure 240 may have a greater width than each of the first gate structures 210.

The first dummy gate lines 220 may be located on the first gate structures 210. The second gate structure 240 may be located on the first dummy gate lines 220. The second gate structure 240 may include at least one second dummy gate line 240B1 and at least one second real gate line 240B2. The first dummy gate lines 220 may each have a width that is substantially the same as or different from the first gate structure 210. For example, the first dummy gate lines 220 may each have the first width W1. The at least one second dummy gate line 240B1 may have a width that is substantially the same as or different from the second gate structure 240. For example, the at least one second dummy gate line 240B1 may have the second width W2. Accordingly, the second dummy gate line 240B1 may have a greater width than the first dummy gate line 220.

The at least one second dummy gate line 240B1 may be located to be adjacent to the first dummy gate lines 220. The first dummy gate lines 220 and the at least one second dummy gate line 240B1 may be electrically connected. In this case, the first dummy gate lines 220 and the at least one second dummy gate line 240B1 may be dummy selection lines or dummy word lines, and the at least one second real gate line 240B2 may be a selection line or a word line.

The channel structures 250 may be located within the first gate structures 210. For example, the channel structures 250 may extend through the first gate structures 210 and the second gate structure 240. The channel structures 250 may extend through the second gate structure 240, the first dummy gate lines 220, and the first gate structures 210. The channel structures 250 may each include a channel layer 250A, a memory layer 250B surrounding the channel layer 250A, or an insulating core 250C within the channel layer 250A or may include the channel layer 250A, the memory layer 250B, or the insulating core 250C in combination. A separation insulating structure 230 may be located between the channel structures 250.

In one embodiment, the first dummy gate lines 220 and the at least one second dummy gate line 240B1 may be vertically adjacent each other. The first dummy gate lines 220 and the at least one second dummy gate line 240B1 may also be electrically connected to each other. The first dummy gate lines 220 and the at least one second dummy gate line 240B1 may be dummy selection lines or dummy word lines.

Figure 3A:
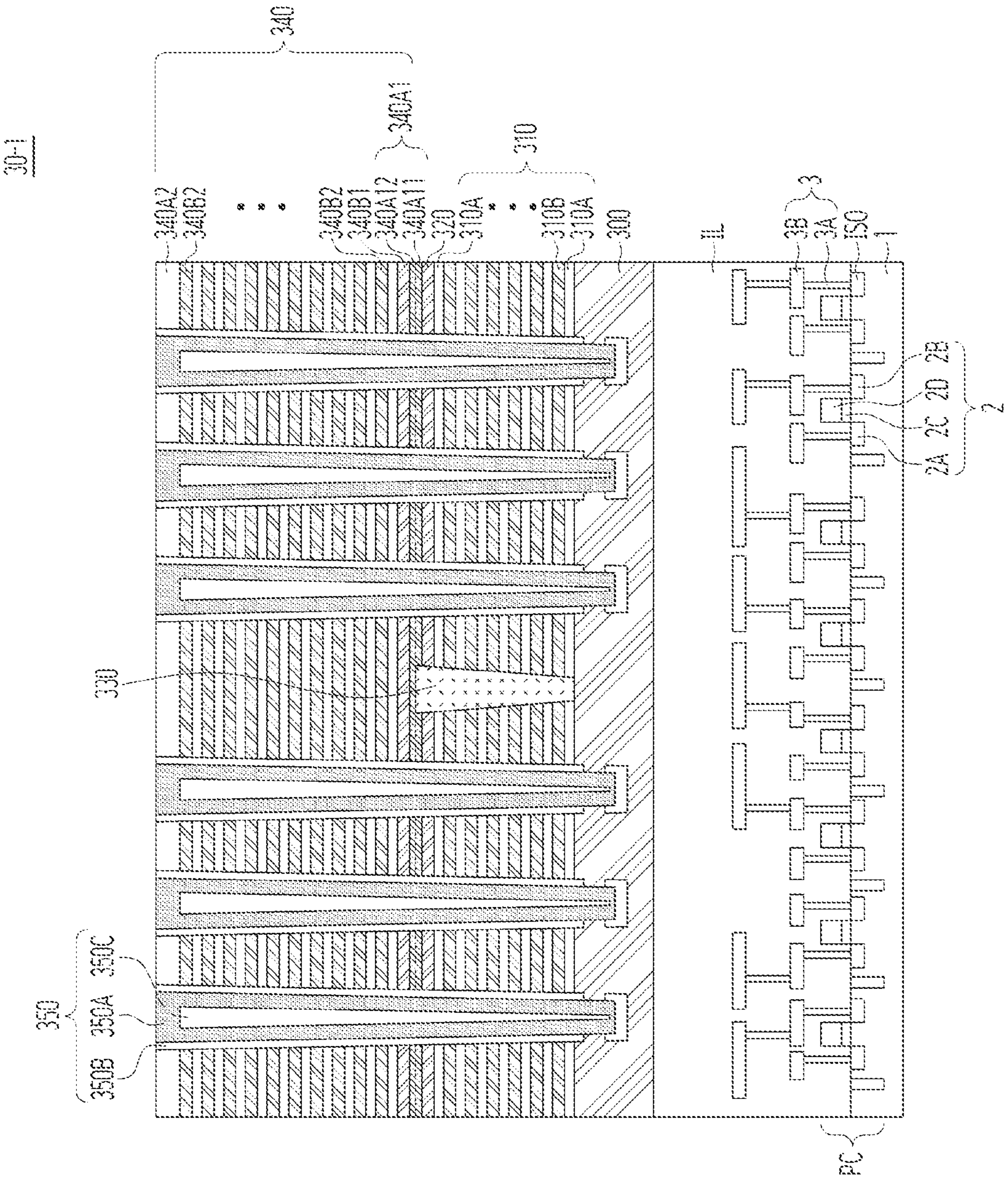
FIGS. 3A and 3B are vertical cross-sectional diagrams for describing a semiconductor memory device according to an embodiment of the present disclosure.
Figure 3B:
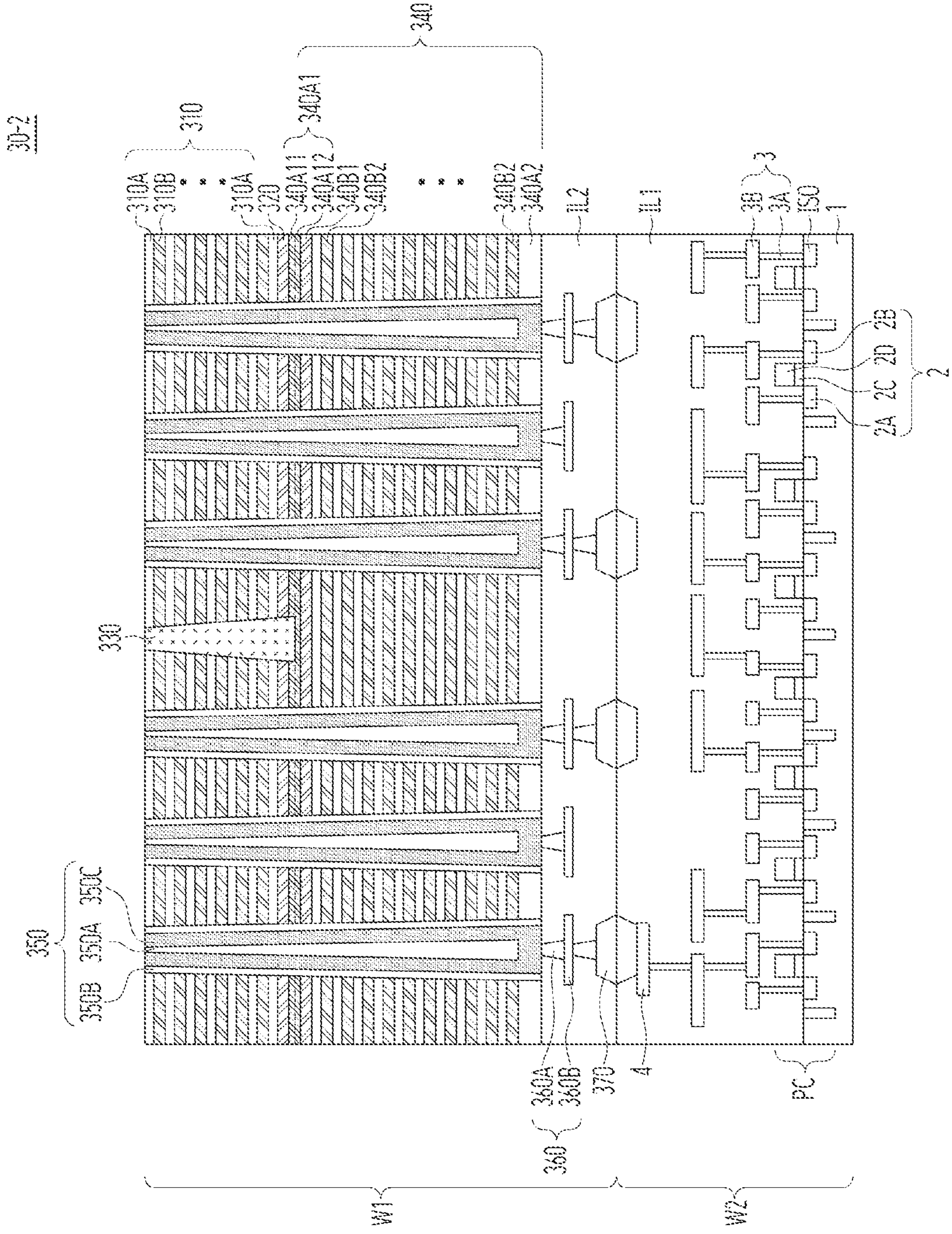

FIGS. 3A and 3B are vertical cross-sectional diagrams of two slightly different semiconductor memory device embodiments, which are identified by reference numerals 30-1 and 30-2. Hereinafter, a descriptions of redundant elements are omitted in the interest of brevity.

Referring to FIG. 3A, the semiconductor memory device 30-1 may include first gate structures 310, first dummy gate lines 320, a separation insulating structure 330, a second gate structure 340, and tapered channel structures 350. The semiconductor memory device may further include a substrate 1, a source structure 300, an interconnection structure 3, an interlayer insulating layer IL, or a peripheral circuit PC or may further include the substrate 1, the source structure 300, the interconnection structure 3, the interlayer insulating layer IL, or the peripheral circuit PC in combination.

As shown in FIG. 3A, the source structure 300 may be located under the first gate structures 310. The source structure 300 may also be connected to the tapered channel structures 350, which may extend into the source structure 300 through the first gate structures 310. A channel layer 350A portion of each of tapered channel structure 350 may be connected to the source structure 300.

A peripheral circuit PC may be located in the substrate 1, which is located below and attached to the source structure 300. An isolation layer ISO may be located within the substrate 1. An active area may be defined by the isolation layer ISO. The peripheral circuit PC may include one or more transistors 2, one or more capacitors and one or more registers. In FIG. 3A, a transistor 2 may include a first junction 2A, a second junction 2B, a gate insulating layer 2C, and a gate electrode 2D. The gate insulating layer 2C may be located between the gate electrode 2D and the substrate 1. The gate insulating layer 2C and the isolation layer ISO may each include an insulating material, such as an oxide or a nitride.

The interconnection structure 3 may include contact vias 3A or wires 3B or may include the contact vias 3A or the wires 3B in combination. The interlayer insulating layer IL may be located on the substrate 1. The interconnection structure 3 may be located within the interlayer insulating layer IL. The interconnection structure 3 may be connected to the peripheral circuit PC. The contact vias 3A may each connect each of the junctions 2A and 2B of the transistor 2 and the wire 3B, or may mutually connect the wires 3B. The wires 3B may each be connected to the contact via 3A or may each mutually connect the contact vias 3A. The second contact vias 3A or the second wires 3B may each include a conductive material, such as tungsten.

Referring to FIG. 3B, the semiconductor memory device 30-2 may include first gate structures 310, first dummy gate lines 320, a separation insulating structure 330, a second gate structure 340, channel structures 350, a substrate 1, or a peripheral circuit PC or may include the first gate structures 310, the first dummy gate lines 320, the separation insulating structure 330, the second gate structure 340, the channel structures 350, the substrate 1, or the peripheral circuit PC in combination. The semiconductor memory device may further include a first interconnection structure 360, a second interconnection structure 3, a first bonding pad 370, a second bonding pad 4, an interlayer insulating layer IL1, or an interlayer insulating layer IL2 or may further include the first interconnection structure 360, the second interconnection structure 3, the first bonding pad 370, the second bonding pad 4, the interlayer insulating layer IL1, or the interlayer insulating layer IL2 in combination.

The first interconnection structure 360 may be located under the first gate structures 310 and the second gate structure 340. The first interconnection structure 360 may include first contact vias 360A and first wires 360B. The first contact vias 360A may be connected to the channel structures 350, respectively. The first wires 360B may each be connected to the first contact via 360A, and may each mutually connect the first contact vias 360A. The first contact via 360A and the first wire 360B may each include a conductive material, such as tungsten.

The first bonding pads 370 may be located under the first interconnection structure 360. The first bonding pads 370 may each be connected to at least one of the first contact vias 360A. The channel structures 350 and the peripheral circuit PC may be electrically connected by the first bonding pads 370 and the first interconnection structure 360.

The second bonding pads 4 may be located over the second interconnection structure 3. Each of the second bonding pads 4 may each be connected to one or more corresponding second interconnection structures 3. For example, the second bonding pads 4 may each be connected to at least one of the second "wires" 3B, which are conductive paths or traces formed and embedded in the interlayer insulating layer IL1. The peripheral circuit PC may thus be electrically connected to the channel structures 350 through one or more second interconnection structures 3 and one or more corresponding second bonding pads 4.

Corresponding first bonding pads 370 and second bonding pads 4 may of course be bonded, i.e., electrically connected, to each other. Accordingly, the first gate structures 310, the first dummy gate lines 320, the separation insulating structure 330, the second gate structure 340, the channel structures 350, the first interconnection structure 360, and the first bonding pads 370 may be included in a first wafer W1. The substrate 1, the peripheral circuit PC, the second interconnection structure 3, and the second bonding pads 4 may be included in a second wafer, W2. The semiconductor memory device 30-2 may thus have a structure in which the first wafer W1 and the second wafer W2, and their respective components, are mechanically and electrically bonded to each other.

A substrate of the first wafer W1 may require removal as part of the process of manufacturing the semiconductor device, before the first and second wafers are bonded to each other. For claim construction purposes, the designations of a structure being "upper" (or over) and "lower" (or under) are relative and are used herein solely for convenience of description. The second wafer W2 may thus be located over the first wafer.

According to the foregoing description, the semiconductor devices depicted in at least FIGS. 3A and 3B may thus be, or have, a bonded wafer structure. The channel structures 350 may belong to and be part of the first wafer W1. The peripheral circuit PC may belong to and be part of the second wafer W2. The substrate of the first wafer W1 may be removed in a process of manufacturing the semiconductor memory device 30-1 or 30-2. The degree of memory integration of the semiconductor memory device 30-1 and 30-2, can therefore be dramatically increased by separately forming the first wafer W1, having a memory cell array, and the second wafer W2, having the peripheral circuit PC. The separately-formed wafers W1 and W2 can be bonded to each other after their formations.

FIGS. 4A to 4E are vertical cross-section diagrams illustrating steps of a method of manufacturing a semiconductor memory device according to embodiments of the present disclosure. Hereinafter, a description of contents redundant with the aforementioned contents is omitted.

Figure 4A:
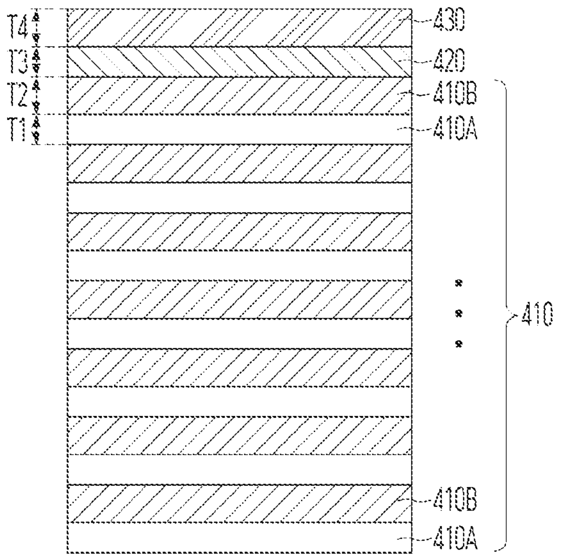
FIGS. 4A to 4E are vertical cross-sectional diagrams illustrating a method of manufacturing a semiconductor memory device according to an embodiment of the present disclosure.

Referring to FIG. 4A, a first stack 410 may be formed by alternately stacking (also known as forming interleaved layers) first material layers 410A and second material layers 410B. Each first material layer 410A may be an insulating material, such as an oxide. Each second material layer 410B may be a sacrificial material, such as a nitride.

Each first material layer 410A may have a first thickness T1. Each second material layer 410B may have a second thickness T2. The first thickness T1 and the second thickness T2 may be substantially the same or they may be different from each other. For example, the second thickness T2 may be greater than the first thickness T1.

After the first stack 410 is formed, a first sacrificial layer 420 may be formed on the first stack 410. The first sacrificial layer 420, which may have a third thickness, T3, may be used as a polishing stop layer in a subsequent process. The third thickness T3 may be substantially the same as or different from the first thickness T1 as well as the second thickness T2. For example, the third thickness T3 may be less than the first thickness T1. The first sacrificial layer 420 may be a non-conductive material, such as an oxide.

Next, a second sacrificial layer 430 may be formed on the first sacrificial layer 420. The second sacrificial layer 430 may have a fourth thickness T4. The fourth thickness T4 may be substantially the same as or different from the first thickness T1, the second thickness T2, or the third thickness T3. For example, the fourth thickness T4 may be smaller than the second thickness T2. The second sacrificial layer 430 may be removed by being etched in a process of forming a separation insulating structure 440 in a subsequent process. The second sacrificial layer 430 may include a material having high etch selectivity with respect to the first sacrificial layer 420. For example, the second sacrificial layer 430 may include a sacrificial material, such as nitride or polysilicon.

Figure 4B:
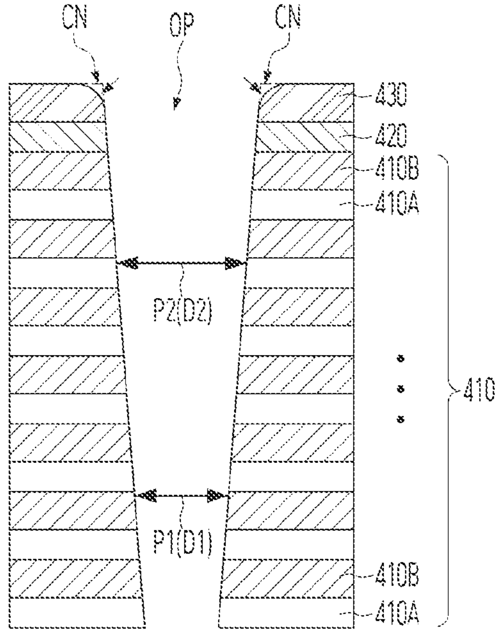

Referring to FIG. 4B, an opening OP may be formed within the first stack 410. For example, the opening OP that extends into the first stack 410 may be formed through the second sacrificial layer 430 and the first sacrificial layer 420. The opening OP may include a first part P1 having a first width D1 and a second part P2 having a second width D2. The second width D2 may be substantially the same as or different from the first width D1. As shown in FIG. 4B, the second width D2 may be greater than the first width D1, in which case the vertical cross-sectional shape of the opening OP will resemble a trapezoid because the shape of the opening OP is tapered.

Next, the corner, CN, of the second sacrificial layer 430, which is of course exposed during the formation of the opening OP, may be rounded over. The exposure or creation of a seam between the inside surface of the opening OP and the outside surface of a separation insulating structure (not illustrated), which is formed inside the opening OP in a subsequent process, can be reduced or even prevented by rounding-over the edge of the top surface of the second sacrificial layer 430 exposed by forming the opening OP.

Figure 4C:
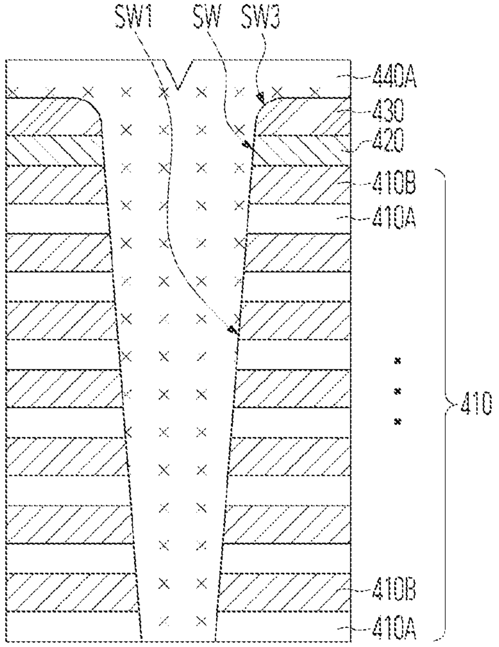

Referring to FIG. 4C, a preliminary insulating structure 440A, which may be an insulating an oxide, may be formed within the opening OP. More particularly, the preliminary insulating structure 440A may be formed inside the opening OP such that the material comprising the insulating structure is in direct contact with sidewalls, SW1, of the layers comprising the stack 410, the sidewall, SW2 of the first sacrificial layer 420, and the sidewall, SW3 of the second sacrificial layer 430, each sidewall being exposed by the formation of the opening OP. The preliminary insulating structure 440A may include an insulating material, such as oxide.

Figure 4D:
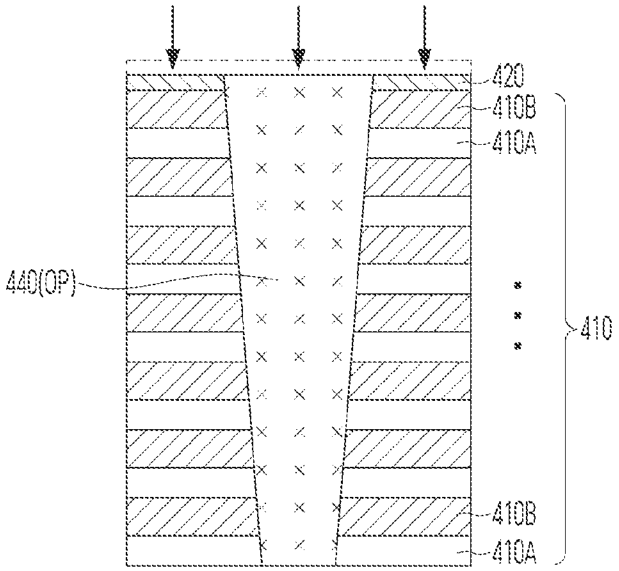

Referring to FIG. 4D, the separation insulating structure 440 may be formed. For example, the separation insulating structure 440 may be formed within the opening OP by etching or otherwise removing a top portion of the preliminary insulating structure 440A as well as the second sacrificial layer 430 so that the first sacrificial layer 420 is exposed. First, the second sacrificial layer 430 may also be etched while the preliminary insulating structure 440A is etched. Next, the first sacrificial layer 420 may be etched by some thickness. In this case, the first sacrificial layer 420 may be used as a polishing stop layer. The level of an upper surface of the first sacrificial layer 420 and the level of an upper surface of the separation insulating structure 440 may be substantially the same. For reference, the thickness of the first sacrificial layer 420 that is etched in order to remove a seam that is formed within the preliminary insulating structure 440A may be adjusted.

The separation insulating structure 440 may be used to mutually insulate one or more of gate lines (not illustrated) that are formed substantially at the same level in a subsequent process. For example, the separation insulating structure 440 may mutually insulate the gate lines (not illustrated) that are used as source selection lines and that are formed substantially at the same level. Accordingly, the gate lines (not illustrated) that are mutually insulated may be individually driven.

For reference, the second material layer 410B, that is, the highest second material layer of all the stacked second material layers 410B, may be formed relatively thickly, and may be used as a polishing stop layer in a process of forming the separation insulating structure 440. The same sacrificial material as that of the second material layer 410B may be formed on the etched second material layer 410B, that is, the highest part, and the separation insulating structure 440. Accordingly, the thickness of the second material layer 410B, that is, the highest part, may be greater than the thickness of the remaining second material layers 410B.

In a process of forming a conductive material within the openings from which the second material layers 410B have been removed in a subsequent process, a seam may occur because only a part of the conductive material is formed within the opening from which the second material layer 410B that is relatively thick, that is, the highest part, has been removed. Accordingly, surrounding layers may be damaged because a fume occurs at a level corresponding to the second material layer 410B, that is, the highest part.

However, according to an embodiment of the present disclosure, the thickness of each of the second material layers 410B, that is, the highest part, can be formed to be substantially the same as the thickness of each of the remaining second material layers 410B by forming the first sacrificial layer 420 and the second sacrificial layer 430. Accordingly, the damage to surrounding layers due to a seam or fume, occurring at a level corresponding to the second material layer 410B that is the highest part, can be reduced.

Figure 4E:
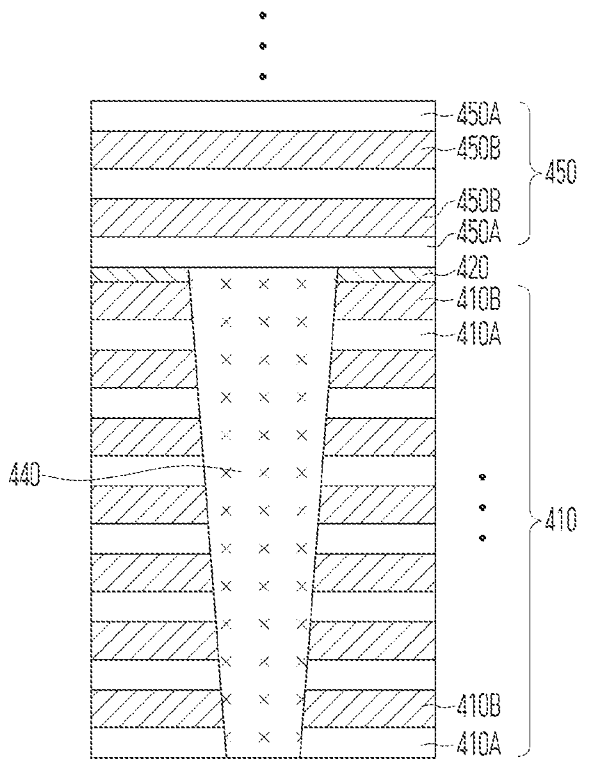

Referring to FIG. 4E, a second stack 450 comprising a second set of alternately stacked (interleaved) layers may be formed on the first stack 410. For example, the second stack 450 may be formed on the separation insulating structure 440 and the first sacrificial layer 420. The second stack 450 may include third material layers 450A and fourth material layers 450B that are alternately stacked. The third material layers 450A may include substantially the same material as the first material layers 410A. The fourth material layers 450B may include substantially the same material as the second material layers 410B. For example, the third material layers 450A may each include an insulating material, such as oxide. The fourth material layers 450B may each include an insulating material, such as nitride.

The lowermost third material layer 450A, among the third material layers 450A, may contact the separation insulating structure 440. For example, a lower surface of the lowermost third material layer 450A and an upper surface of the separation insulating structure 440 may contact each other. An interface may be present between the lowermost third material layer 450A and the first sacrificial layer 420 because the third material layer 450A and the first sacrificial layer 420 are formed by separate processes. However, the present disclosure is not limited thereto. The lowermost third material layer 450A and the first sacrificial layer 420 may constitute a single layer.

The lowermost third material layer 450A may have a fifth thickness T5, and the remaining third material layers 450A may each have a sixth thickness T6. The fifth thickness T5 or the sixth thickness T6 may be substantially the same as or different from the first thickness T1 of the first material layers 410A. For example, the fifth thickness T5 may be smaller than the first thickness T1. The sum of the thickness of the first sacrificial layer 420 that remains and the fifth thickness T5 may be greater than the first thickness T1 or the sixth thickness T6. The sixth thickness T6 may be substantially the same as the first thickness T1. The fourth material layers 450B may each have a seventh thickness T7. The seventh thickness T7 may be substantially the same as or different from the second thickness T2 of the second material layers 410B. For example, the seventh thickness T7 may be substantially the same as the second thickness T2.

For reference, if the third material layer 450A and the first sacrificial layer 420 are formed into a single layer by forming the third material layer 450A on the first sacrificial layer 420, the third material layer 450A may have a thickness different from that of the first insulating layers 410A or the second insulating layers 450A. However, the first sacrificial layer 420, the third material layer 450A, the first insulating layers 410A, and the second insulating layers 450A may each include oxide. The bending of the oxide may occur relatively less although a thickness difference occurs.

According to the aforementioned manufacturing method, the thicknesses of the second material layers 410B can be uniformly formed because the first sacrificial layer 420, that is, a metal oxide layer, is used as a polishing stop layer. Accordingly, damage to surrounding layers due to a seam or fume, occurring at a level corresponding to the second material layer 410B, that is, the highest part, can be prevented.

Furthermore, the preliminary insulating structure 440A may be etched by using the first sacrificial layer 420 as a polishing stop layer. Accordingly, although a seam is formed in the preliminary insulating structure 440A, the seam might not be present in the separation insulating structure 440 by etching the first sacrificial layer 420 to the height at which the seam can be removed.

A single layer may be constructed by forming the third material layer 450A, including oxide, on the first sacrificial layer 420 that is, an oxide layer. The third material layer 450A may have a thickness different from that of each of other material layers 410A and 450A. However, the bending of the oxide may occur relatively less although the thickness difference occurs.

As stated above, the corner of the second sacrificial layer 430 (not visible in FIG. 4E) may be rounded over as a result of etching the opening OP. Accordingly, the forming of a seam within the preliminary insulating structure 440A in a process of forming the preliminary insulating structure 440A can be prevented, minimized, or reduced. Accordingly, a fume occurring in the semiconductor memory device because a seam remains within the separation insulating structure 440 can be prevented, minimized, or reduced.

Figure 5A:
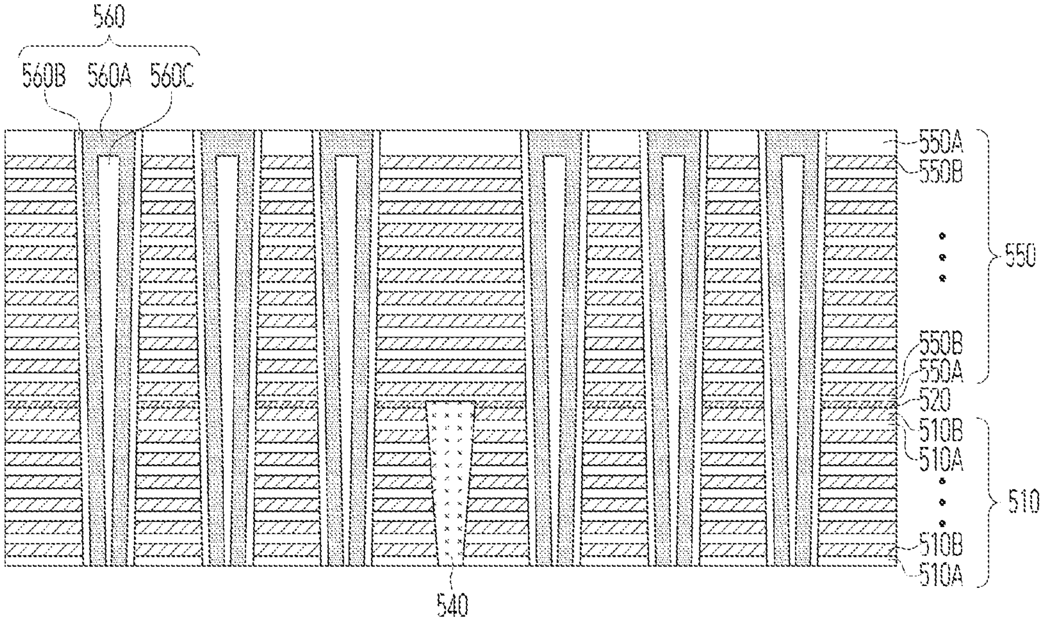
FIGS. 5A and 5B are vertical cross-sectional diagrams illustrating a method of manufacturing a semiconductor memory device according to an embodiment of the present disclosure.
Figure 5B:
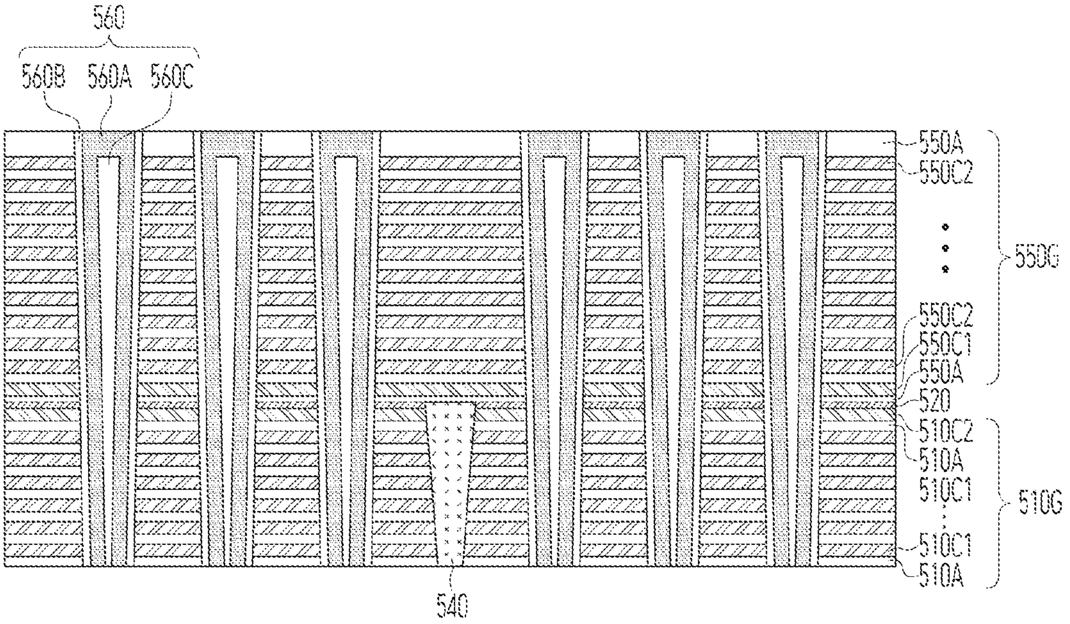

FIGS. 5A and 5B are vertical cross-sectional illustrating steps of a method of manufacturing a semiconductor memory device according to an embodiment of the present disclosure. Hereinafter, a description of contents redundant with the aforementioned contents is omitted.

Referring to FIG. 5A, a first stack 510 including first material layers 510A and second material layers 510B that are alternately stacked may be formed. Next, a first sacrificial layer 520 may be formed on the first stack 510. Next, a second sacrificial layer (not illustrated) may be formed on the first sacrificial layer 520. Next, after an opening (not illustrated) that extends through the second sacrificial layer (not illustrated), the first sacrificial layer 520, and the first stack 510 is formed, a preliminary insulating structure (not illustrated) may be formed within the opening (not illustrated). Next, a separation insulating structure 540 may be formed within the opening (not illustrated) by etching the preliminary insulating structure (not illustrated) and the second sacrificial layer (not illustrated) so that the first sacrificial layer 520 is exposed. In this case, the first sacrificial layer 520 may be used as a polishing stop layer, and may be etched by some thickness.

Next, a second stack 550 may be formed by alternately stacking third material layers 550A and fourth material layers 550B on the first sacrificial layer 520 and the separation insulating structure 540. In this case, the lowermost third material layer 550A, among the third material layers 550A, may contact the separation insulating structure 540.

Next, channel structures 560 that extend through the second stack 550, the first sacrificial layer 520, and the first stack 510 may be formed. The channel structures 560 may each include a channel layer 560A, a memory layer 560B surrounding the channel layer 560A, or an insulating core 560C within the channel layer 560A or may each include the channel layer 560A, the memory layer 560B, or the insulating core 560C in combination.

Referring to FIG. 5B, the second material layer 510B and the fourth material layer 550B may be substituted with gate lines 510C1, 510C2, 550C1, and 550C2. First, a slit (not illustrated) that extends through the second stack 550, the first sacrificial layer 520, and the first stack 510 may be formed. Next, the gate lines 510C1, 510C2, 550C1, and 550C2 may be formed by forming a conductive material within an opening that is formed by removing the second material layers 510B and the fourth material layers 550B within the stacks 510 and 550 through the slit (not illustrated). For reference, if the second material layers 510B and the fourth material layers 550B each includes a conductive material, an alternative process may be omitted. In such a case, the second material layers 510B and the fourth material layers 550B may be used as the gate lines 510C1, 510C2, 550C1, and 550C2. For reference, a silicidation process for reducing specific resistance of the second material layers 510B and the fourth material layers 550B may also be performed.

The gate lines 510C1, 510C2, 550C1, and 550C2 may mean a first real gate line 510C1, a first dummy gate line 510C2, a second dummy gate line 550C1, and a second real gate line 550C2, respectively. The first real gate line 510C1 or the second real gate line 550C2 may be a selection line or a word line. For example, the first real gate line 510C1 may be a selection line, and the second real gate line 550C2 may be a word line. The first dummy gate line 510C2 or the second dummy gate line 550C1 may be a dummy selection line or a dummy word line. For example, the first dummy gate line 510C2 and the second dummy gate line 550C1 may each be a dummy word line.

The first real gate lines 510C1 that are formed substantially at the same level may be mutually insulated by the separation insulating structure 540. Furthermore, the first dummy gate lines 510C2 that are formed substantially at the same level may be mutually insulated by the separation insulating structure 540. Accordingly, the first real gate lines 510C1 that are mutually insulated or the first dummy gate lines 510C2 that are mutually insulated can be individually driven. The first dummy gate lines 510C2 and the second dummy gate line 550C1 may be electrically connected.

For reference, if a difference between the thicknesses of each of the second material layers 510B and each of the fourth material layers 550B occurs in a process of forming the gate lines 510C1, 510C2, 550C1, and 550C2, a seam may occur at a level corresponding to the first dummy gate lines 510C2. A fluorine-series source gas may remain within the seam, and thus surrounding layers may be damaged because a fume occurs. However, the present disclosure can reduce the occurrence of a seam or fume because the first sacrificial layer 520 is used as a polishing stop layer and the gate lines 510C1, 510C2, 550C1, and 550C2 can have uniform thicknesses.

According to the aforementioned description, the first real gate lines 510C1 that are mutually insulated and the first dummy gate lines 510C2 that are mutually insulated, by the separation insulating structure 540, can be individually driven.

Furthermore, the first dummy gate lines 510C2 and the second dummy gate line 550C1 can be electrically connected. The first dummy gate lines 510C2 and the second dummy gate line 550C1 can be driven by using the same bias. Accordingly, a bridge risk of the first real gate lines 510C1 and the second real gate lines 550C2 can be reduced.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor memory device comprising:
first gate structures each comprising interleaved first real gate lines and first insulating layers;
first dummy gate lines each located on a corresponding one of the first gate structures;
a separation insulating structure formed within and configured to extend between the first dummy gate lines and between the first gate structures; and
a second gate structure located on the first gate structures and the separation insulating structure, the second gate structure comprising a second dummy gate line having a greater width than each of the first dummy gate lines.

2. The semiconductor memory device of claim 1, wherein the first dummy gate lines and the second dummy gate line are electrically connected to each other.

3. The semiconductor memory device of claim 1, wherein the second gate structure comprises:
second real gate lines stacked on the second dummy gate line; and
second insulating layers, alternately stacked on the second dummy gate line along with the second real gate lines.

4. The semiconductor memory device of claim 3, wherein:
the first real gate lines are selection lines, and
the second real gate lines are word lines.

5. The semiconductor memory device of claim 3, wherein the second gate structure has a width greater than a width of the first gate structures.

6. The semiconductor memory device of claim 3, wherein the separation insulating structure extends into a lowermost second insulating layer, among the second insulating layers.

7. The semiconductor memory device of claim 6, wherein an upper surface of the separation insulating structure is located between an upper surface and lower surface of the lowermost second insulating layer.

8. The semiconductor memory device of claim 1, wherein the separation insulating structure comprises:
a first part having a first width, and
a second part having a second width greater than the first width.

9. The semiconductor memory device of claim 8, wherein the second part is closer to the second gate structure than is the first part.

10. The semiconductor memory device of claim 1, wherein:
the first insulating layers each have a first thickness, and
the first real gate lines each have a second thickness greater than the first thickness.

11. The semiconductor memory device of claim 10, wherein the first dummy gate lines each have a third thickness substantially identical with the second thickness.

12. The semiconductor memory device of claim 10, wherein a lowermost second insulating layer, among the second insulating layers, has a fourth thickness greater than the first thickness.

13. The semiconductor memory device of claim 3, wherein:
a lowermost second insulating layer, among the second insulating layers, comprises a sacrificial layer and an insulating layer located on the sacrificial layer, and
the separation insulating structure contacts a lower surface of the insulating layer through the sacrificial layer.

14. The semiconductor memory device of claim 1, further comprising channel structures that extend through the second gate structure, the first dummy gate lines, and the first gate structures.

15. The semiconductor memory device of claim 14, wherein the separation insulating structure is located between the channel structures.

16. A method of manufacturing a semiconductor device, the method comprising:
forming a first stack comprising first material layers and second material layers that are alternately stacked;
forming a first sacrificial layer on top of the first stack;
forming a second sacrificial layer on top of the first sacrificial layer;
forming an opening that extends through the second sacrificial layer, through the first sacrificial layer and into the first stack;
forming a preliminary insulating structure within the opening;
forming a separation insulating structure within the opening by etching the preliminary insulating structure and the second sacrificial layer so that the first sacrificial layer is exposed; and
forming, on the separation insulating structure and the first sacrificial layer, a second stack comprising third material layers and fourth material layers that are alternately stacked.

17. The method of claim 16, further comprising etching a corner of the second sacrificial layer, which is formed and exposed by the formation of the opening.

18. The method of claim 16, wherein the forming of the separation insulating structure comprises etching the first sacrificial layer by some thickness.

19. The method of claim 16, further comprising substituting the second material layers and the fourth material layers with gate lines.

20. The method of claim 19, wherein a lowermost third material layer, among the third material layers, contacts the first sacrificial layer and the separation insulating structure.

21. The method of claim 16, wherein the opening comprises:
a first part having a first width, and
a second part having a second width greater than the first width.

22. The method of claim 16, wherein:
the first material layers each have a first thickness, and
the second material layers each have a second thickness greater than the first thickness.

23. The method of claim 22, wherein the first sacrificial layer has a third thickness smaller than the first thickness.

24. The method of claim 22, wherein the second sacrificial layer has a fourth thickness smaller than the second thickness.

25. The method of claim 22, wherein a lowermost third material layer, among the third material layers, has a fifth thickness smaller than the first thickness.

26. The method of claim 25, wherein remaining third material layers, among the third material layers, each have a sixth thickness substantially identical with the first thickness.

27. The method of claim 22, wherein the fourth material layers each have a seventh thickness substantially identical with the second thickness.

28. The method of claim 16, further comprising forming channel structures that extend through the second stack, the first sacrificial layer, and the first stack.

29. The method of claim 16, wherein the second sacrificial layer comprises a material having high etch selectivity with respect to the first sacrificial layer.

30. The method of claim 29, wherein:

the second sacrificial layer comprises a nitride, and the first sacrificial layer comprises an oxide.

31. The method of claim 16, wherein the first material layers, the separation insulating structure, or the third material layers each comprise an oxide.

32. The method of claim 16, wherein the second material layers or the fourth material layers each comprise a nitride.

* * * * *